(12) United States Patent
Kanba

(10) Patent No.: US 6,873,197 B2
(45) Date of Patent: Mar. 29, 2005

(54) SCAN FLIP-FLOP CIRCUIT CAPABLE OF GUARANTEEING NORMAL OPERATION

(76) Inventor: Kohji Kanba, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 390 days.

(21) Appl. No.: 10/033,438

(22) Filed: Dec. 28, 2001

(65) Prior Publication Data

US 2002/0087930 A1 Jul. 4, 2002

(51) Int. Cl.[7] .................. H03K 3/289; H03K 3/356
(52) U.S. Cl. .................. 327/202; 327/203; 714/726
(58) Field of Search .................. 327/199, 200, 327/202, 203, 208–212, 218; 714/724, 726, 727, 731

(56) References Cited

U.S. PATENT DOCUMENTS 5,689,517 A * 11/1997 Ruparel .................. 714/731
6,181,179 B1 * 1/2001 Kanba .................. 327/202
6,240,536 B1 * 5/2001 Mikan et al. .................. 714/727

FOREIGN PATENT DOCUMENTS

| JP | 01-096573 | 4/1989 | .......... G01R/31/28 |
| JP | 2000-002754 | 1/2000 | .......... G01R/31/28 |

* cited by examiner

*Primary Examiner*—Tuan T. Lam
(74) *Attorney, Agent, or Firm*—Hayes Soloway P.C.

(57) ABSTRACT

In a scan flip-flop circuit, a first master latch circuit receives usual mode data at a usual data input terminal in synchronization with a first clock signal. A second master latch circuit receives scan-in data at a scan-in data input terminal in synchronization with first and second scan clock signals. A slave latch circuit receives an output signal of the first master latch circuit in synchronization with said first clock signal and the second scan clock signal. The slave latch circuit is constructed by a control circuit for controlling transfer of the usual mode data to the output terminal in synchronization with the second scan clock signal.

8 Claims, 8 Drawing Sheets

SCAN FLIP-FLOP CIRCUIT CAPABLE OF GUARANTEEING NORMAL OPERATION

BACKGROUND OF THE INVENTION

1. Field of the Invention

The present invention relates to a logic circuit including logic gate combination circuits and scan flip-flop circuits having a scan path for a test mode, and more particularly, to the improvement of scan flip-flop circuits.

2. Description of the Related Art

In a logic circuit including a large number of logic gates such as AND gates, NAND gates, OR gates, NOR gates, exclusive OR gates and the like, and a large number of flip-flop circuits interposed between the logic gates, the flip-flop circuits cannot usually be accessed directly front the exterior. Therefore, in order to test the logic gates, the logic gates have to be operated step by step, which increases the test time.

In order to reduce the test time for the logic gates included in the logic circuit, a scan path is provided to serially connect the flip-flop circuits to each other between a scan-in terminal and a scan-out terminal. That is, when the scan path is activated, the flip-flop circuits can serve as a shift register. Thus, input data can be written from the scan-in terminal through the scan path into an arbitrary flip-flop circuit, and output data can be read from an arbitrary flip-flop circuit through the scan path to the scan-out terminal.

A prior art scan flip-flop circuit is constructed by a selector circuit operated by a selection signal, a master latch circuit clocked by a clock signal, and a slave latch circuit clocked by the clock signal (see: JP-A-1-96573). This will be explained later in detail.

In the above-described prior art scan flip-flop circuit, however, since there is actually a skew between a clock signal supplied to one scan flip-flop circuit and a clock signal supplied to its adjacent scan flip-flop circuit, a normal operation of the scan flip-flop circuits cannot be guaranteed. This also will be explained later in detail.

SUMMARY OF THE INVENTION

It is an object of the present intention to provide a scan flip-flop circuit for use in a logic circuit capable of guaranteeing a normal operation.

According to the present invention, in a scan flip-flop circuit, a first master latch receives usual mode data at a usual data input terminal in synchronization with a first clock signal, A second master latch circuit receives scan-in data at a scan-in data input terminal in synchronization with first and second scan clock signals. A slave latch circuit receives an output signal of the first master latch circuit in synchronization with said first clock signal and the second scan clock signal. The slave latch circuit is constructed by a control circuit for controlling transfer of the usual mode data to the output terminal in synchronization with the second scan clock signal.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art logic circuit will be explained with reference to FIGS. 1, 2, 3 and 4 (see: JP-A-1-96573).

Figure 1:
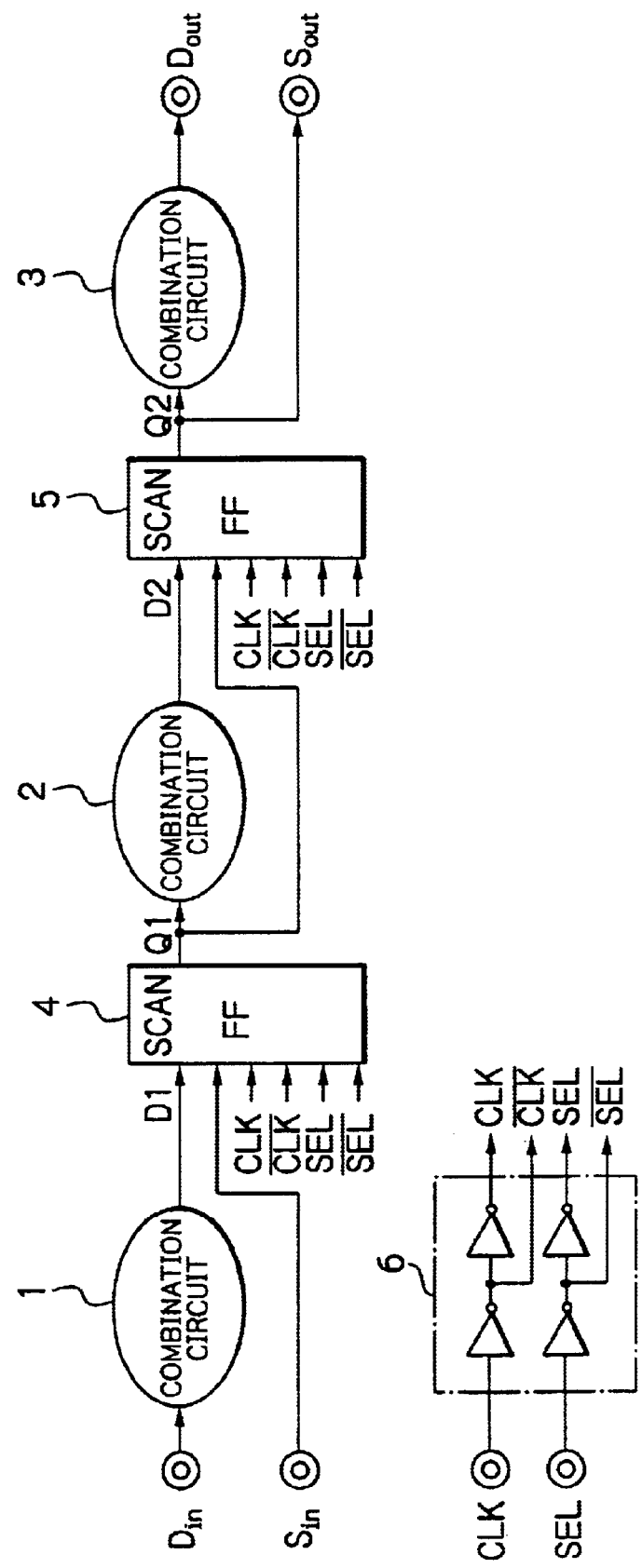
FIG. 1 is a block circuit diagram illustrating a prior art logic circuit.

In FIG. 1, which illustrates a prior art logic circuit, logic gate combination circuits 1, 2 and 3 formed by AND gates, NAND gates, OR gates, NOR gates, EOR gates and the like are connected in series between a data input terminal $D_{in}$, and a data output terminal $D_{out}$. Note that the data input terminal $D_{in}$ is usually constructed by a plurality of terminals, and the data output terminal $D_{out}$ is usually constructed by a plurality of terminals, however, in order to simplify the description, only one terminal is illustrated for each of the data input terminal $D_{in}$ and the data output terminal $D_{out}$.

A scan flip-flop circuit 4 is interposed between the combination circuits 1 and 2, and a scan flip-flop circuit 5 is interposed between the combination circuits 2 and 3.

Also, note that the scan flip-flop circuit 4 is usually constructed by a plurality of flip-flop circuits connected in parallel, and the scan flip-flop circuit 5 is usually constructed by a plurality of flip-flop circuits connected in parallel, however, in order to simplify the description, only one flip-flop circuit is illustrated for each of the scan flip-flop circuit 4 and the scan flip-flop circuit 5.

The scan flip-flop circuit 4 receives selectively the output signal D1 of the combination circuit 1 and scan-in data at a scan-in terminal $S_{in}$ in response to clock signals CLK and $\overline{CLK}$ and selection signals SEL and $\overline{SEL}$ generated from a clock signal generating circuit 6, and generates an output signal Q1.

Similarly, the scan flip-flop circuit 5 receives selectively the output signal D2 of the combination circuit 2 and the output signal Q1 of the scan flip-flop circuit 4 in response to the clock signals CLK and $\overline{CLK}$ and the selection signals SEL and $\overline{SEL}$ generated from the clock signal generating circuit 6 and generates an output signal Q2.

In a usual operation mode, the selection signal SEL is low (="0"), so that the combination circuit 1, the scan flip-flop circuit 4, the combination circuit 2, the scan flip-flop circuit 5 and the combination circuit 3 are electrically connected in series between the data input terminal $D_{in}$, and the data output terminal $D_{out}$.

On the other hand, in a test operation mode, the selection signal SEL is high (="1"), so that the scan flip-flop circuit 4, the combination circuit 2 and the scan flip-flop circuit 5 are electrically connected in series between the scan-in terminal $S_{in}$ and the scan-out terminal $S_{out}$. As a result, a so-called scan path is realized between the scan-in terminal $S_{in}$ and the scan-out terminal $S_{out}$.

Figure 2:
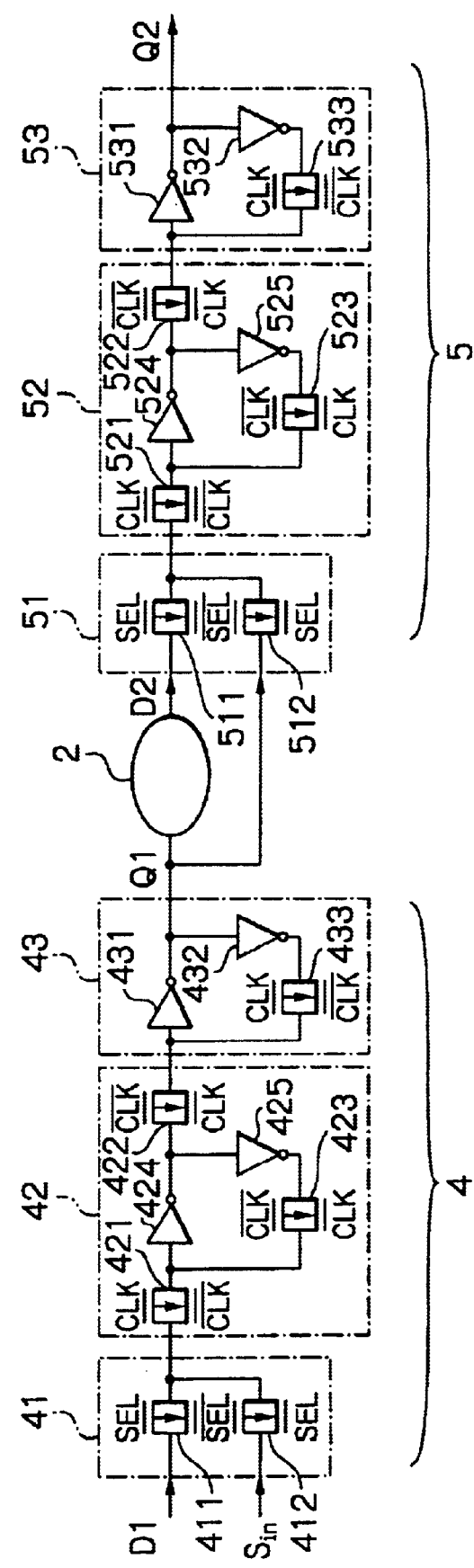
FIG. 2 is a detailed circuit diagram of the scan flip-flop circuits of FIG. 1.

In FIG. 2, which is a detailed circuit diagram of the scan flip-flop circuits 4 and 5 of FIG. 1, the scan flip-flop circuit 4 is constructed by a selector circuit 41 operated by the selection signals SEL and $\overline{SEL}$, a master latch circuit 42 clocked by the clock signals CLK and $\overline{CLK}$, and a slave latch circuit 43 clocked by the clock signals CLK and $\overline{CLK}$. Similarly, the scan flip-flop circuit 6 is constructed by a selector circuit 51 operated by the selection signals SEL and $\overline{SEL}$, a master latch circuit 52 clocked by the clock signals CLK and $\overline{CLK}$, and a slave latch circuit 53 clocked by the clock signals CLK and $\overline{CLK}$.

In more detail, the selector 41 (51) is constricted by transfer gates 411 (511) and 412 (512). Also, the master latch circuit 42 (52) is constructed by transfer gates 421, 422 and 423 (521, 522 and 523) and inverters 424 and 425(524 and 525). Further, the slave latch circuit 43 (53) is constructed by inverters 431 and 432(531 and 532) and a transfer gate 433 (533), In a usual operation mode, the selection signal SEL is low. Therefore, the output signal D1 of the combination circuit 1 of FIG. 1 is supplied via the selector 41 to the master latch circuit 42 and the slave latch circuit 43 which are both opened by the clock signal CLK, so that the output signal D1 of the combination circuit 1 is supplied to the combination circuit 2. Similarly, the output signal D2 of the combination circuit 2 is supplied via the selector 51 to the master latch circuit 52 and the slave latch circuit 53 which are both clocked by the clock signal CLK, so that the output signal D2 of the combination circuit 2 is supplied to the combination circuit 3.

A normal scan-in operation of the scan flip-flop circuits 4 and 5 of FIG. 2 is explained next with reference to FIG. 3. In this case, the selection signal SEL is caused to be high (="1"), and assume that data S1 and S2 are written into the scan flip-flop circuits 4 and 5, respectively, i.e., the slave latch circuits 43 and 53, respectively.

Figure 3:
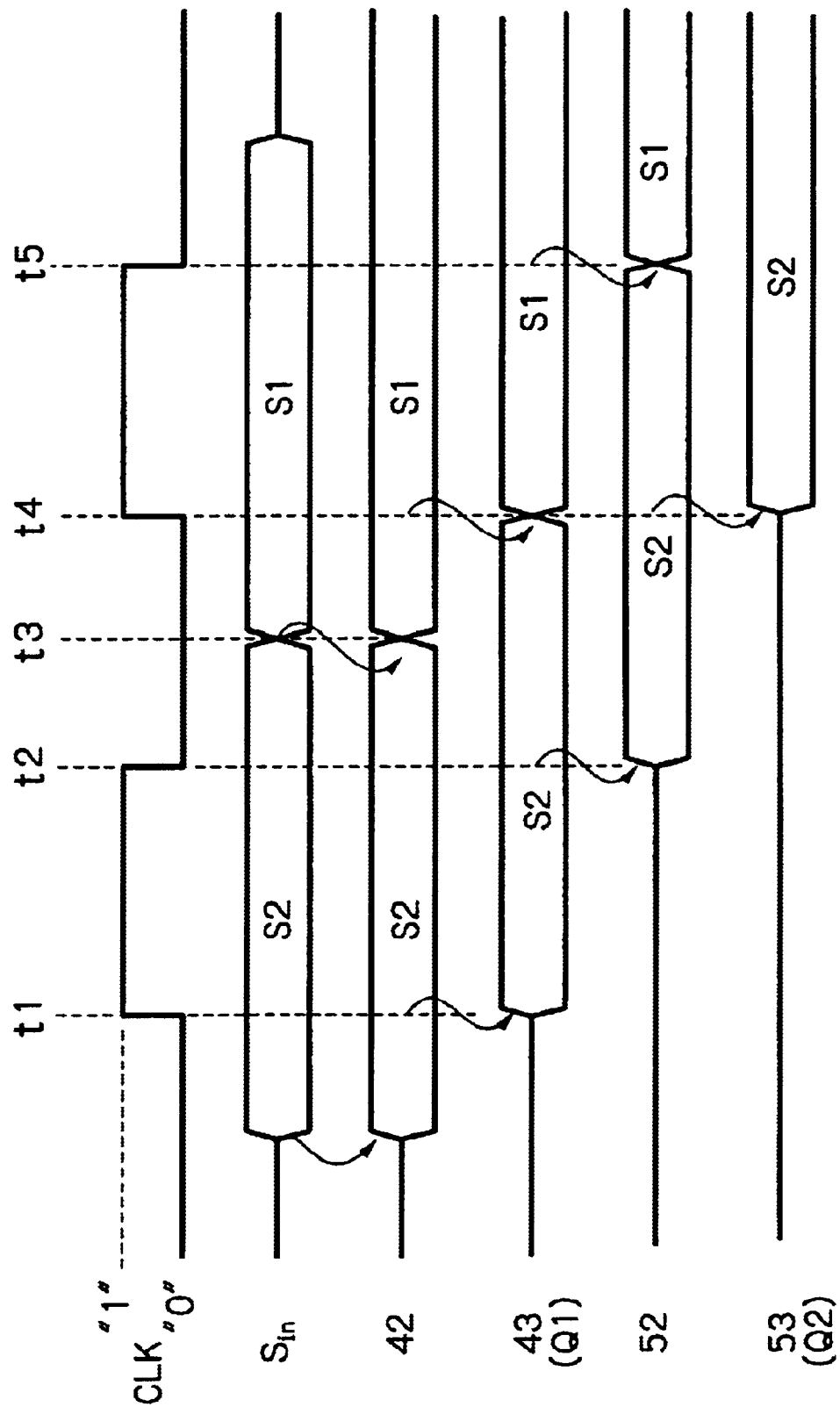
FIG. 3 is a timing diagram for explaining a normal operation of the scan flip-flop circuits of FIG. 2.

As shown in FIG. 3, data S2 and S1 are supplied from the scan-in terminal $S_{in}$ via the selector circuit 41 to the master latch circuit 42 in synchronization with the clock signal CLK.

Before time t1, since the clock signal CLK is low (="0"), the transfer gate 421 is opened, so that the data S2 is latched in the master latch circuit 42.

Next, at time t1, since the clock signal CLK is switched from low (="0") to high (="1"), the transfer gate 421 is cloud while the transfer gates 422 and 423 are opened, so that the data S2 is transferred from the master latch circuit 42 to the slave latch circuit 43 (i. e., Q1=S2).

Next, at time t2, since the clock signal CLK is switched from high (="1") to low (="0"), the transfer gate 521 is closed while the transfer gates 522 and 523 are closed, so that the data S2 is transferred from the slave latch circuit 43 to the master latch circuit 52.

Next, at time t3, since the clock signal CLK is low (="0"), the transfer gate 421 is opened, so that the data S1 is latched in the master latch circuit 42.

Next, at time t4, since the clock signal CLK is switched from low (="0") to high (="1"), the transfer gate 421 is closed while the transfer gates 422 and 423 are opened, so that the data S1 is transferred from the master latch circuit 42 to the slave latch circuit 43 (i. e., Q1=S1). Simultaneously, the transfer gate 421 is closed while the transfer gates 522 and 523 are opened, so that the data S2 is transferred from the master latch circuit 52 to the slave latch circuit 53 (i. e., Q2=S2).

Next, at time t5, since the clock signal CLK is switched from high (="1") to low (="0"), the transfer gate 521 is opened while the transfer gates 522 and 523 are closed, so that the data S1 is transferred from the slave latch circuit 43 to the master latch circuit 52.

Thus, the output signals Q1 and Q2 of the scan flip-flop circuits 4 and 5 show the data S1 and S2, respectively.

After that, the combination circuits 1, 2 and 3 are operated. Finally, a scan-out operation similar to the above-described scan-in operation is carried out. As a result, data obtained at the scan-out terminal $S_{out}$ is compared with expected data, thus determining whether the combination circuits 1, 2 and 3 are normal or abnormal.

In FIG. 3, the clock signal CLK is supplied to the scan flip-flop circuits 4 and 5 without skew. However, there is a skew between the clock signals supplied to the scan flip-flop circuits 4 and 5, which cannot guarantee the above-described normal operation. This will be explained next with reference to FIG. 4.

Figure 4:
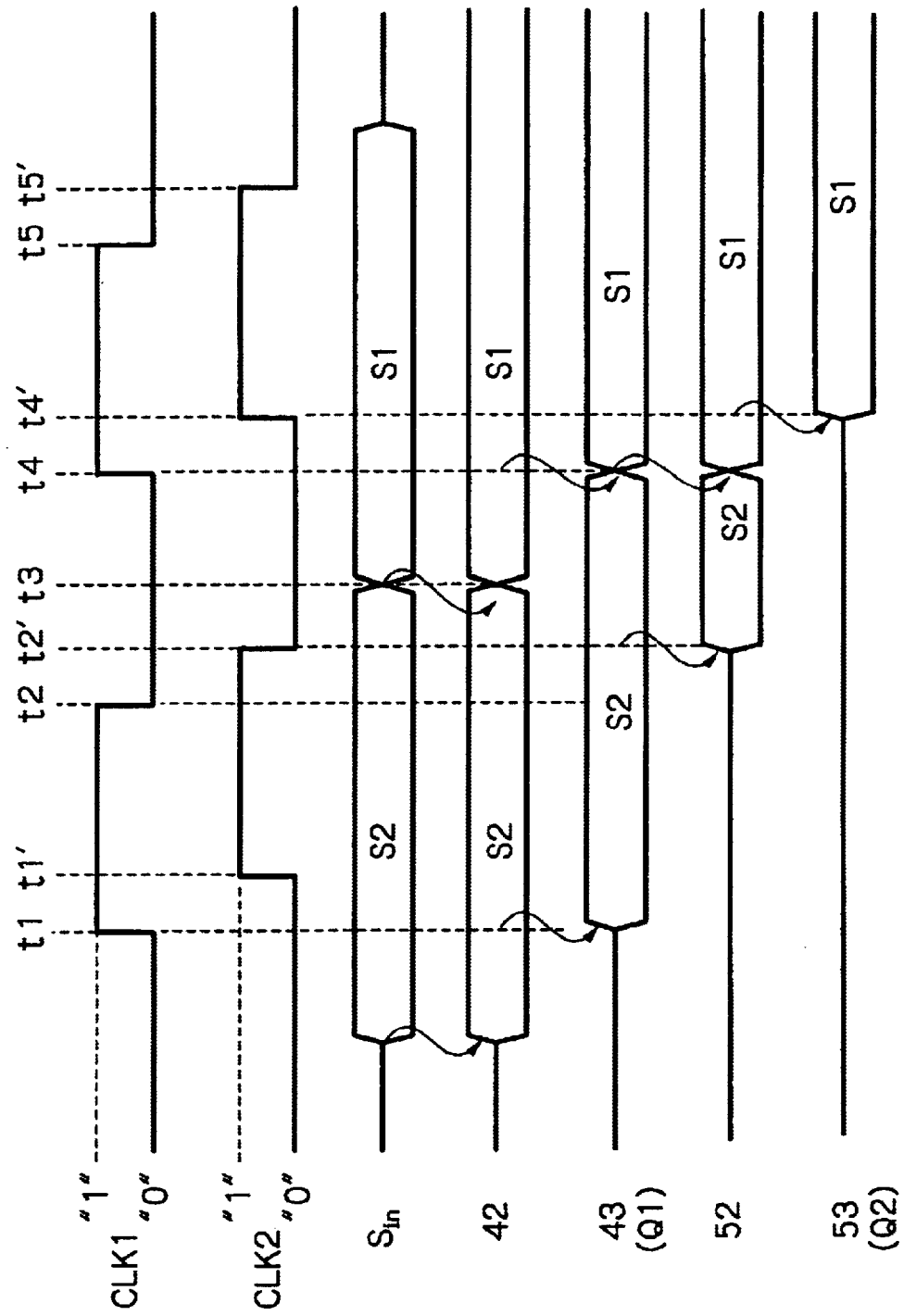
FIG. 4 is a timing diagram for explaining an abnormal operation of the scan flip-flop circuits of FIG. 2.

In FIG. 4, a clock, signal CLK2 supplied to the scan flip-flop circuit 5 is a little delayed as compared with a clock signal CLK1 supplied to the scan flip-flop circuit 4.

As shown in FIG. 4, data S2 and S1 are also supplied from the scan-in terminal $S_{in}$ via the selector circuit 41 to the master latch circuit 42 in synchronization with the clock signals CLK1 and CLK2.

Before time t1, since the clock signal CLK1 is low (="0"), the transfer gate 421 is opened, so that the data S2 is latched in the master latch circuit 42.

Next, at time t1, since the clock signal CLK1 is switched from low (="0") to high (="1"), the transfer gate 421 is closed while the transfer gates 422 and 423 are opened, so that the data S2 is transferred from the master latch circuit 42 to the slave latch circuit 43 (i. e., Q1=S2).

At time t1', the clock signal CLK2 is switched from low (="0") to high (="1"), and at time t2, the clock signal CLK1 is switched from high (="1") to low (="0"). In this case, no significant operation is observed.

Next, at time t2', since the clock signal CLK2 is switched from high (="1") to low (="0"), the transfer gate 521 is opened while the transfer gates 522 and 523 are closed, so that the data S2 is transferred from the slave latch circuit 43 to the master latch circuit 52.

Next, at time t3, since the clock signal CLK is low (="0"), the transfer gate 421 is opened, so that the data S1 is latched in the master latch circuit 42.

Next, at time t4, since the clock signal CLK is switched from low (="0") to high (="1"), the transfer gate 421 is closed while the transfer gates 422 and 423 are opened, so that bite data S1 is transferred from the master latch circuit 42 to the slave latch circuit 43 (i. e., Q1=S1). In this case, since the clock signal CLK2 is still low (="0"), the transfer gate 521 is opened while the transfer gates 522 and 523 are closed, so that the data S1 is further transferred from the slave latch circuit 43 to the master latch circuit 52.

Next, at time t4', the clock signal CLK2 is switched from low (="0") to high (="1"), the transfer gate 521 is closed while the transfer gates 522 and 523 are opened, so that the data S1 is transferred from the master latch circuit 52 to the slave latch circuit 53 (i. e., Q2=S1).

Next, at time t5, since the clock signal CLK is switched from high (="1") to low (="0"), and at time t5', the clock signal CLK2 is switched from high (="1") to low (="0"). In this case, no significant operation is observed.

Thus, the output signals Q1 and Q2 of the scan flip-flop circuits 4 and 5 both show the data S1. Therefore, it is impossible to perform a test operation using the scan path upon the combination circuits 1, 2 and 3.

Figure 5:
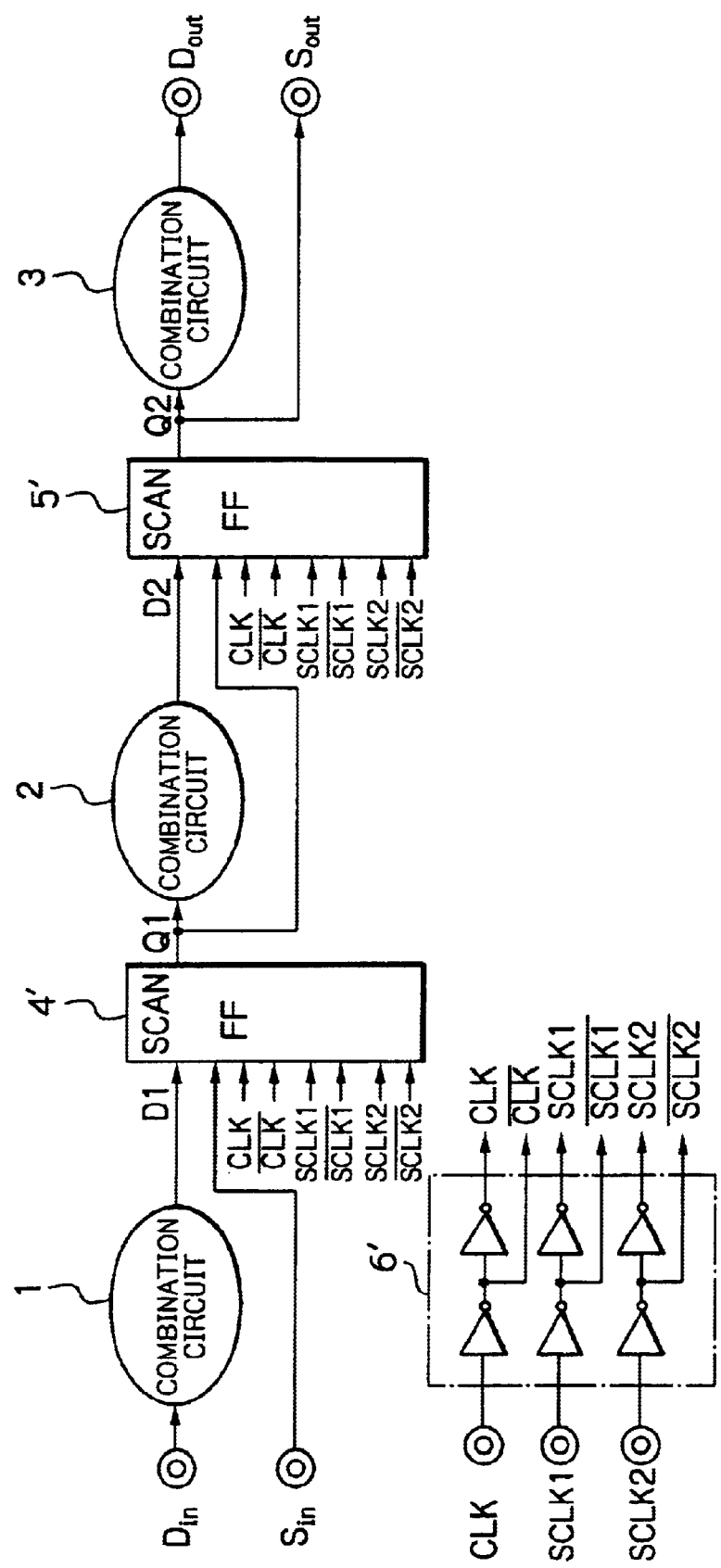
FIG. 5 is a block circuit diagram illustrating an embodiment of the logic circuit according to the present invention.

In FIG. 5, which illustrates an embodiment of the logic circuit according to the present invention, scan flip-flop circuits 4' and 5' and a clock signal generating circuit 6' are provided instead of the scan flip-flop circuits 4 and 5 and the clock signal generating circuit 6, respectively, of FIG. 1.

The scan flip-flop circuit 4' receives selectively the output signal D1 of the combination circuit 1 and scan-in data at the scan-in terminal $S_{in}$ in response to clock signals CLK and $\overline{CLK}$ and scan clock signals SCLK1, $\overline{SCLK1}$, SCLK2 and $\overline{SCLK2}$ generated from the clock signal generating circuit 6' and generates an output signal Q1.

Similarly, the scan flip-flop circuit 5' receives selectively the output signal D2 of the combination circuit 2 and the output signal Q1 of the scan flip-flop circuit 4 in response to the clock signals CLK and $\overline{CLK}$ and the scan clock signals SCLK1, $\overline{SCLK1}$, SCLK2 and $\overline{SCLK2}$ generated from the clock signal generating circuit 6' and generates an output signal Q2.

In a usual operation mode, the scan clock signal SCLK2 is low (="0") while the clock signal CLK is clocked, the combination circuit 1, the scan flip-flop circuit 4, the combination circuit 2, the scan flip-flop circuit 5 and the combination circuit 3 are electrically connected in series between the data input terminal $D_{in}$ and the data output terminal $D_{out}$.

On the other hand, in a test operation mode, the scan clock signals SCLK1 and SCLK2 are clocked, the scan flip-flop circuit 4', the combination circuit 2 and the scan flip-flop circuit 5' are electrically connected in series between the scan-in terminal $S_{in}$ and the scan-out terminal $S_{out}$. As a result, a so-called scan path is realized between the scan-in terminal $S_{in}$ and the scan-out terminal $S_{out}$.

Figure 6:
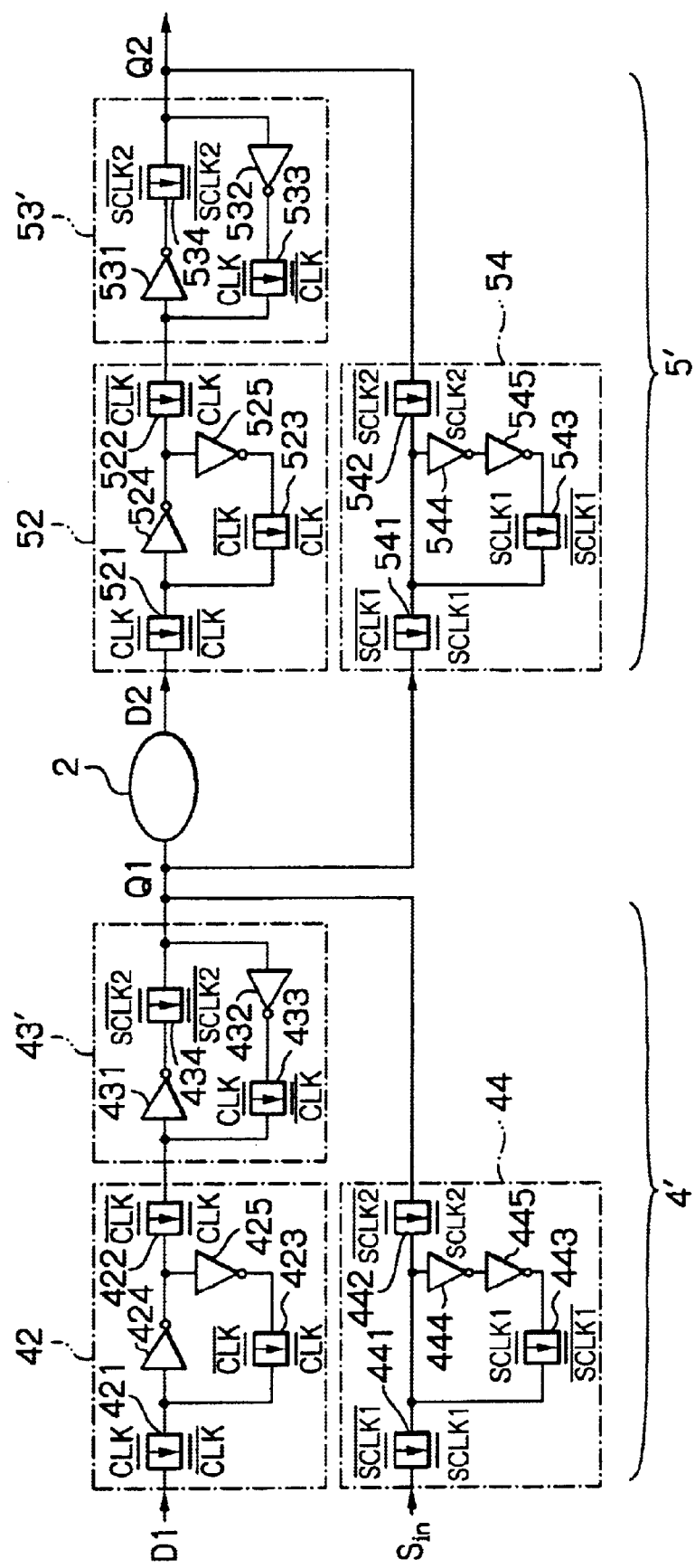
FIG. 6 is a detailed circuit diagram of the scan flip-flop circuits of FIG. 5.

FIG. 6 is a detailed circuit diagram of the scan flip-flop circuits 4' and 5' of FIG. 5.

In the scan flip-flop circuit 4', the selector circuit 41 of FIG. 2 is not provided. Also, the master latch circuit 42 clocked by the clock signals CLK and $\overline{CLK}$ and a slave latch circuit 43, clocked by the clock signals CLK and $\overline{CLK}$ and the scan clock signals SCLK2 and $\overline{SCLK2}$ are used for receiving the output signal D1 of the combination circuit 1. Note that, the slave latch circuit 42' is a modification of the slave latch circuit 42 of FIG. 2. Further, a master latch circuit 44 clocked by the scan clock signals SCLK1, $\overline{SCLK1}$, SCLK2 and $\overline{SCLK2}$ is provided for receiving the scan data at the scan-in terminal $S_{in}$.

Similarly, in the scan flip-flop circuit 5', the selector circuit 51 of FIG. 2 is not provided. Also, the master latch circuit 52 clocked by the clock signals CLK and $\overline{CLK}$ and a slave latch circuit 53' clocked by the clock signals CLK and $\overline{CLK}$ and the scan clock signals SCLK2 and $\overline{SCLK2}$ are used for receiving the output signal D2 of the combination circuit 2. Note that, the slave latch circuit 52' is a modification of the slave latch circuit 52 of FIG. 2. Further, a master latch circuit 54 clocked by the scan clock signals SCLK1, $\overline{SCLK1}$, SCLK2 and $\overline{SCLK2}$ is provided for receiving the output signal Q1 of the scan flip-flop circuit 4'.

In more detail, the slave latch circuit 43'(53') includes a transfer gate 434(534) in addition to the elements of the slave latch circuit 43(53) of FIG. 2. Also, the master latch circuit 44 (54) is constructed by transfer gates 441, 442 and 443 (541, 542 and 543) and inverters 444 and 445(544 and 545). In this case, the transfer gates 441 and 443 (541 and 543) are clocked by the scan clock signals SCLK1 and $\overline{SCLK2}$, while the transfer gate 442(542) is clocked by the scan clock signals SCLK2 and $\overline{SCLK2}$.

In a usual operation mode, the scan clock signal SCLK2 is low. Therefore, the output signal D1 of the combination circuit 1 of FIG. 1 is supplied to the master latch circuit 42 and the slave latch circuit 43' which are both clocked by the clock signal CLK, so that the output signal D1 of the combination circuit 1 is supplied to the combination circuit 2. Similarly, the output signal D2 of the combination circuit 2 is supplied to the master latch circuit 52 and the slave latch circuit 53' which are both clocked by the clock signal CLK, so that the output signal D2 of the combination circuit 2 is supplied to the combination circuit 3.

A scan-in operation of the scan flip-flop circuits 4' and 5' of FIG. 6 is explained next with reference to FIG. 7. In this case, the clock signal CLK is caused to be high (="1"), and it is assumed that data S1 and S2 are written into the scan flip-flop circuits 4' and 5', respectively, i.e., the master latch circuits 44 and 54, respectively.

Figure 7:
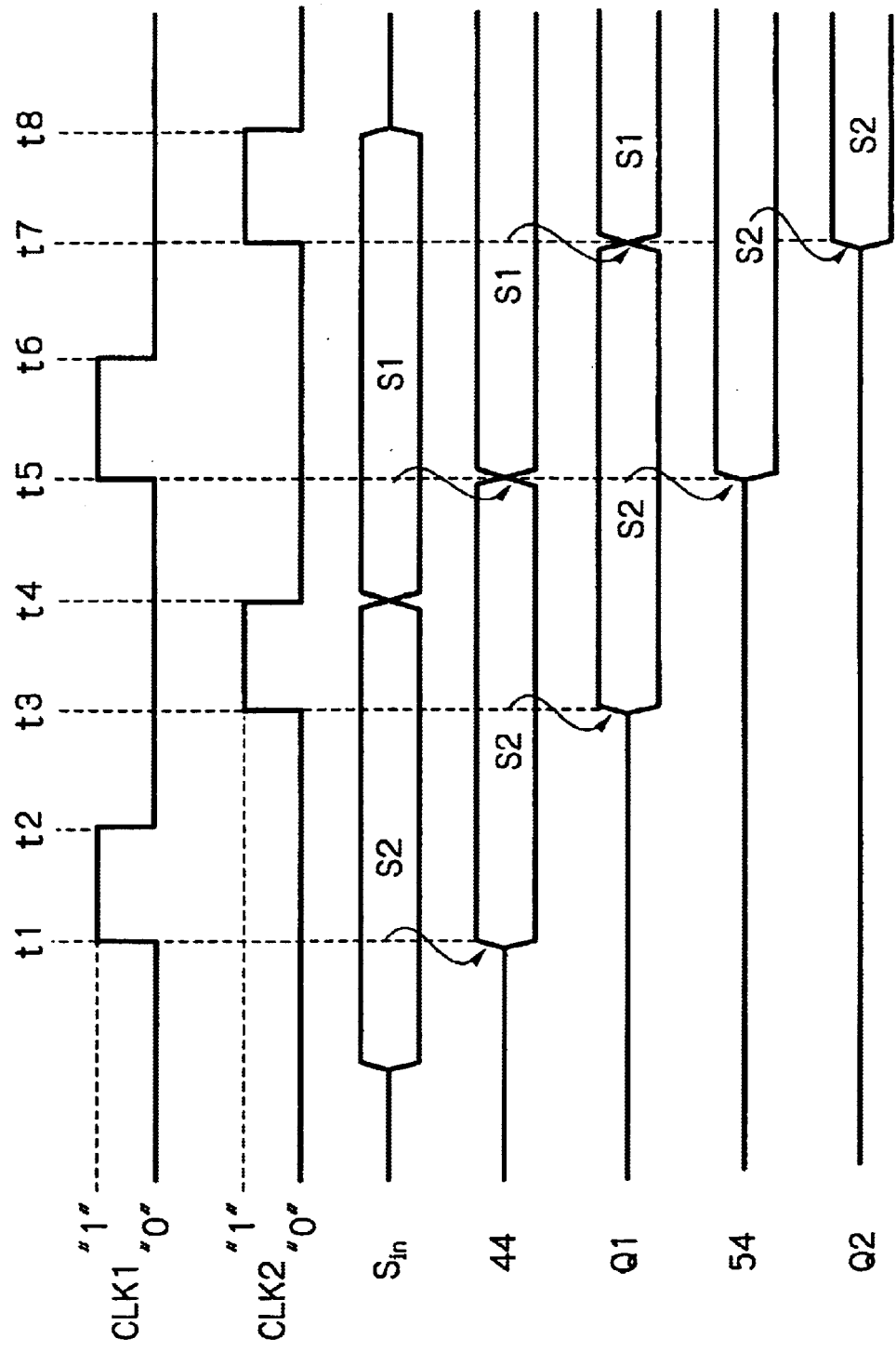
FIG. 7 is a timing diagram for explaining an operation of the scan flip-flop circuits of FIG. 6.

As shown in FIG. 7, data S2 and S1 are supplied from the scan-in terminal $S_{in}$ to the master latch circuit 44 in synchronization with the scan clock signals SCLK1 and SCLK2.

Before time t1, since the scan clock signals SCLK1 is low (="0"), the transfer gate 421 is closed.

Next, at time t1, the transfer gate 441 is opened while the transfer gates 442 and 443 are closed, so that the data S2 is latched in the master latch circuit 44. Then, at time t2, the transfer gates 441 and 443 are closed and opened, respectively.

Next, at time t3, since the scan clock signal SCLK2 is twitched from low (="0") to high (="1"), the transfer gate 442 is opened while the transfer gate 434 of the slave latch circuit 42' are opened, so that the data S2 is surely transferred from the master latch circuit 44 to the output Q1 of the slave latch circuit 43' (i. e., Q1=S2), since the closed transfer gate 434 stops the transfer of data from the master latch circuit 42 thereto. Then, at time t4, the transfer gates 442 and 434 are closed and opened, respectively. In this case, the data S2 of the output Q1 of the slave latch circuit 43' is kept by the closed transfer gate 433.

Next, at time t5, the transfer gate 441 is opened while the transfer gates 442 and 443 are closed, so that the data S2 is latched in the master latch circuit 44. Simultaneously, the transfer gate 541 is opened which the transfer gates 542 and 543 are closed, so that the data S1 is latched in the master latch circuit 54. Then, at time t5, the transfer gates 441 and 443 are closed and opened, respectively, and the transfer gates 541 and 543 are closed and opened, respectively.

Next, at time t7, since the scan clock signal SCLK2 is switched from low (="0") to high (="1"), the transfer gate 442 is opened while the transfer gate 434 of the slave latch circuit 42' is opened, so that the data S1 is surely transferred from the master latch circuit 44 to the output Q1 of the slave latch circuit 43' (i. e., Q1=S1), since the closed transfer gate 434 stops the transfer of data from the master latch circuit 42 thereto. Simultaneously, the transfer gate 542 is opened while the transfer gate 534 of the slave latch circuit 52' is opened, so that the data S2 is surely transferred from the master latch circuit 54 to the output Q2 of the slave latch circuit 53' (i. e., Q2=S2), since the closed transfer gate 534 stops the transfer of data from the master latch circuit 52 thereto. Then, at time t8, the transfer gates 442 and 434 are closed and opened, respectively, and the transfer gates 542 and 534 are closed and opened, respectively in this case, the data S1 of the output Q1 of the slave latch circuit 43' is kept by the closed transfer gate 433. Also, the data S2 of the output Q2 of the slave latch circuit 53' is kept by the closed transfer gate 533.

In the above-described embodiment, since a scan-in operation is carried out by two scan clock signals SCLK1 and SCLK2, an erroneous operation in the logic circuit of FIGS. 1 and 2 can be avoided. Also, due to the presence of the transfer gate 434 (534) in the slave latch circuit 43' (53'), the data of the master latch circuit 43 (52) cannot pass through the slave latch circuit 43' (53') in a scan-in operation mode.

Figure 8:
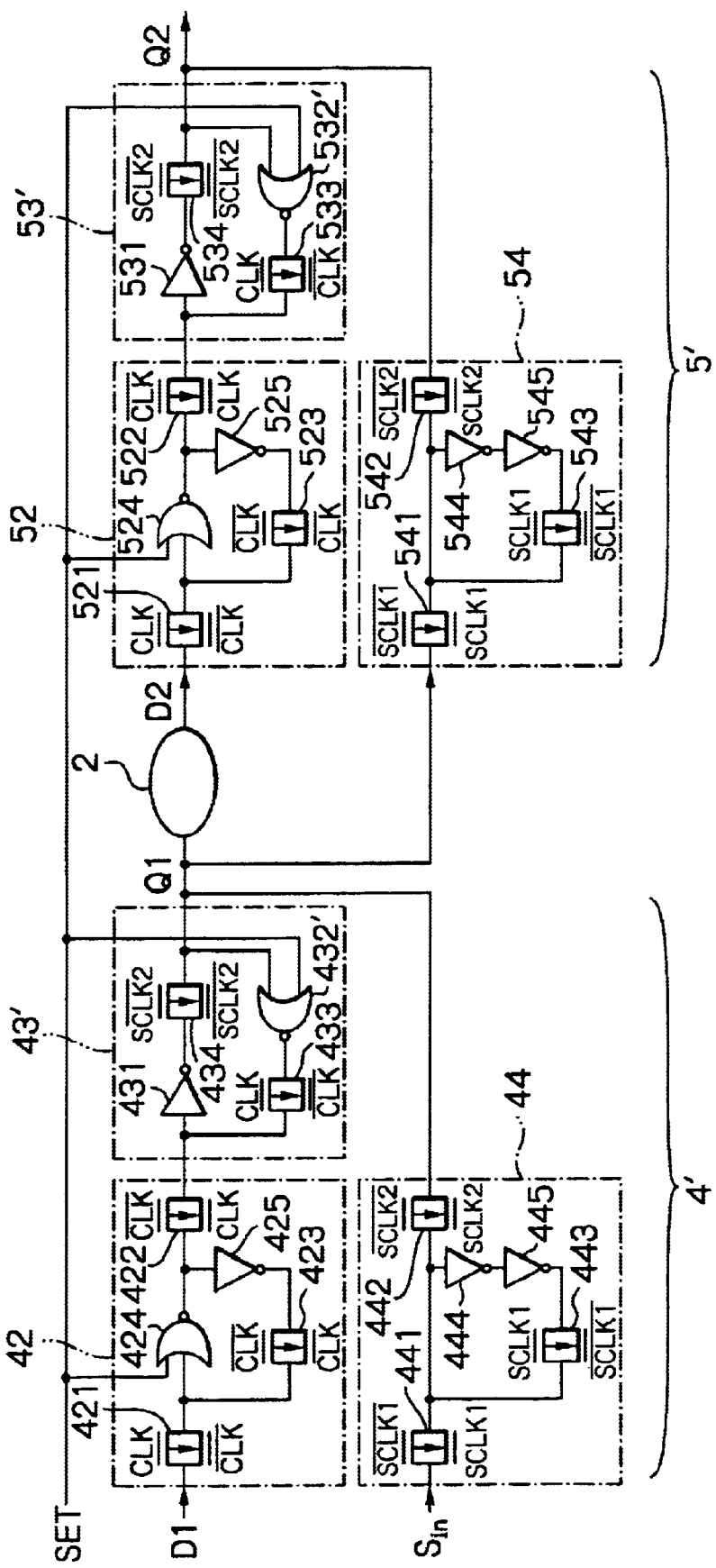
FIG. 8 is a block circuit diagram illustrating a modification FIG. 5.

In FIG. 8, which illustrates a modification of the scan flip-flop circuit 4' and 5' of FIG. 6, a NOR gate 424' (524') is provided instead of the inverter 424 (524), and a NOR gate 432' (532') is provided instead of the inverter 432 (532). When the NOR gates 424' (524') and 432' (532') receive a set signal SET, the master latch circuit 42 (52) and the slave latch circuit 42' (52') are set. Other operations of the scan flip-flop circuits 4' and 5' are the same as those of FIG. 6.

As explained hereinabove, according to the present invention, a first master latch circuit and a slave latch circuit for receiving usual mode data and a second master latch circuit for receiving scan-in data are provided, and the slave latch circuit includes a control circuit controlled by a scan clock signal to control a data path between the first master latch circuit and the output of the slave latch circuit. As a result, an erroneous scan-in operation can be avoided.

What is claimed is:

1. A scan flip-flop circuit comprising:

a usual mode data input-terminal;

a scan-in data input terminal;

an output terminal;

a first master latch circuit, connected between said usual data input terminal, for receiving usual mode data at said usual data input terminal in synchronization with a first clock signal;

a second master latch circuit, connected to said scan-in data input terminal and said output terminal, for receiving scan-in data at said scan-in data input terminal in synchronization with first and second scan clock signals; and a slave latch circuit, connected between said first master latch circuit and said output terminal, for receiving an output signal of said first master latch circuit in synchronization with said first clock signal and said second scan clock signal, said slave latch circuit comprising a control circuit, connected between an output of said first master latch circuit and said output terminal, for controlling transfer of said usual mode data to said output terminal in synchronization with a second clock signal independent of said first clock signal.

2. The scan flip-flop circuit as set forth in claim 1, wherein said second clock signal is said second scan clock signal.

3. The scan flip-flop circuit as set forth in claim 1, wherein said first master latch circuit comprises:

a first transfer gate connected to said usual mode data input terminal;

a first inverter connected to said first transfer gate;

a second transfer gate connected between said first inverter and said slave latch circuit; and a second inverter and a third transfer gate connected in series between an input and an output of said first inverter, said first, second and third transfer gates being controlled in synchronization with said first clock signal, so that said first transfer gate is operated opposite to said second and third transfer gates.

4. The scan flip-flop circuit as set forth in claim 1, wherein said slave latch circuit comprises:

a third inverter connected between said first master latch circuit and said control circuit, said control circuit being connected to said output terminal; and a fourth inverter and a fourth transfer gate connected in series between said output terminal and the output of said first master latch circuit, said fourth transfer gate being controlled in synchronization with said first clock signal.

5. The scan flip-flop circuit as set forth in claim 1, wherein said second master latch circuit comprises:

fifth and sixth transfer gates connected between said scan-in data input terminal and said output terminal; and fifth and sixth inverters and a seventh transfer gate connected in series to a connection between said fifth and sixth inverters, said fifth and seventh transfer gates being controlled in synchronization with said first scan clock signal, so that said fifth transfer gate is operated opposite to said seventh transfer gate, said sixth transfer gate being controlled in synchronization with said second scan clock signal.

6. The scan flip-flop circuit as set forth in claim 1, wherein said first master latch circuit comprises:

a first transfer gate connected to said usual mode data input terminal;

a first NOR gate having a first input connected to said first transfer gate and a second input for receiving a set signal;

a second transfer gate connected between said first NOR gate and said slave latch circuit; and a first inverter and a third transfer gate connected in series between the first input and an output of said first NOR gate, said first, second and third transfer gates being controlled in synchronization with said first clock signal, so that said first transfer gate is operated opposite to said second and third transfer gates.

7. The scan flip-flop circuit as set forth in claim 1, wherein said slave latch circuit comprises:

a second inverter connected between said first master latch circuit and said control circuit, said control circuit being connected to said output terminal; and a second NOR gate having a first input connected to said second inverter, a second input for receiving a set signal, and an output;

a fourth transfer gate connected between the output of second NOR gate and the output of said first master latch circuit, said fourth transfer gate being controlled in synchronization with said first clock signal.

8. A scan flip-flop circuit comprising:

a usual mode data input terminal;

a scan-in data input terminal;

an output terminal;

a first master latch circuit, connected to said usual data input terminal, for receiving usual mode data at said usual data input terminal in synchronization with a clock signal;

a second master latch circuit, connected to said scan-in data input terminal and said output terminal, for receiving scan-in data at said scan-in data input terminal in synchronization with first and second scan clock signals;

a slave latch circuit, connected between said first master latch circuit and said output terminal, for receiving an output signal of said first master latch circuit in synchronization with said clock signal and said second scan clock signal, said slave latch circuit comprising a control circuit, connected between an output of said first master latch circuit and said output terminal, for controlling transfer of said usual mode data to said output terminal in synchronization with said second scan clock signal, so that when said second master latch circuit generates an output signal and transmits it to said output terminal, said control circuit stops transfer of said usual mode data to said output terminal.

\* \* \* \* \*

UNITED STATES PATENT AND TRADEMARK OFFICE
CERTIFICATE OF CORRECTION

PATENT NO. : 6,873,197 B2
DATED : March 29, 2005
INVENTOR(S) : Kanba

It is certified that error appears in the above-identified patent and that said Letters Patent is hereby corrected as shown below:

Title page,
Insert Item -- [30] Foreign Application Priority Data
            JP 2000-399689, December 28, 2000 --.
Insert Item -- [73] Assignee: NEC Electronics Corporation --.

Signed and Sealed this

Ninth Day of August, 2005

JON W. DUDAS
*Director of the United States Patent and Trademark Office*